United States Patent
Irwin

[19]

[11] Patent Number: 5,774,023
[45] Date of Patent: Jun. 30, 1998

[54] ADAPTIVE PHASE LOCKED LOOP SYSTEM WITH CHARGE PUMP HAVING DUAL CURRENT OUTPUT

[75] Inventor: James Stuart Irwin, Paige, Tex.

[73] Assignee: Motorola, Inc., Schaumburg, Ill.

[21] Appl. No.: 846,695

[22] Filed: Apr. 30, 1997

[51] Int. Cl.$^6$ .............................. H03L 1/02; H03L 7/089; H03L 7/093; H03L 7/18

[52] U.S. Cl. ................................ 331/17; 331/16; 331/25; 331/66; 327/105; 327/157

[58] Field of Search ................................ 331/1 A, 16–18, 331/25, DIG. 2, 66, 175–176; 327/105–107, 156–159; 375/376; 455/260

[56] References Cited

U.S. PATENT DOCUMENTS 5,675,291 10/1997 Sudjian ..................................... 331/17

Primary Examiner—David Mis

[57] ABSTRACT

A phase locked loop (PLL) system receiving a reference frequency and generating an output frequency has a charge pump (28), loop filter (38), an N frequency divider (32), an R frequency divider (24), a Voltage Controlled Oscillator (30) and a phase detector (26). The charge pump (28) has a high current output (62) and a low current output (60). The loop filter (38) responsively coupled to the charge pump (28) has a first pole filter that includes a high current first pole filter capacitor (66), a high current first pole damping resistor (70), a low current first pole filter capacitor (64), a low current first pole damping resistor (68), and a first pole filter capacitor (72). A second pole filter can be added that includes a second pole filter capacitor (76), a second pole damping resistor (74), and a feed forward capacitor (78).

16 Claims, 7 Drawing Sheets

ADAPTIVE PHASE LOCKED LOOP SYSTEM WITH CHARGE PUMP HAVING DUAL CURRENT OUTPUT

CROSS REFERENCE TO RELATED APPLICATION

This application is related to our commonly assigned U.S. patent application entitled "OPTIMIZED COMPUTATION OF FIRST AND SECOND DIVIDER VALUES FOR A PHASE LOCKED LOOP SYSTEM" by James Stuart Irwin, having docket number SC90546A, and filed of even date herewith, now application Ser. No. 08/846,694 filed Apr. 30, 1997.

FIELD OF THE INVENTION

The present invention generally relates to phase-locked loops, and more specifically to computing divider values for Tri-State phase detectors.

BACKGROUND OF THE INVENTION

Phase lock loops are used to generate a set of output frequencies that are accurately controlled by a reference frequency. The frequency step sizes are controlled by a reference frequency divided by R. The output frequency is N times the step size. For many applications, a Tri-State phase detector is the method of choice of implementing a phase lock loop (PLL). One advantage of Tri-State phase detectors over Sample-and-Hold phase detectors or phase lock loops is in low power applications.

FIG. 1 is a prior art block diagram that illustrates a standard non-adaptive phase lock loop implementation. The phase lock loop is driven by an accurate frequency source, such as a crystal oscillator 22. Note that other types of accurate frequency sources are well known in the art. The output of the frequency source 22 is the oscillator frequency 23. The oscillator frequency 23 is divided by a first frequency divider 24. This first frequency divider 24 divides by an integer "R". The R frequency divider 24 sets the step size or reference frequency 25.

A voltage control oscillator (VCO) 30 generates an output frequency 36. The output frequency 36 is divided by integer "N" by the N frequency divider 32. The output of the N frequency divider 32 is equal to the reference frequency 25 which is the output of the R frequency divider 24. Phase detector (PD) 26 compares the outputs of the R frequency divider 24 and the N frequency divider 32. The phase detector 26 generates output current pulses proportional to the error between divider signals 25 and 34. These error pulses from the phase detector 26 are received as input by a charge pump 28. The charge pump 28 produces current sinking or sourcing current pulses ultimately for a loop filter 38 which is applied to voltage control oscillator (VCO) 30.

A typical loop filter 38 is shown. It consists of loop filter capacitor 40 in series with loop damping resistor 42. In parallel with loop filter capacitor 40 and loop damping resistor 42 is first pole capacitor 44. This is the first pole of the loop filter. The second pole of the loop filter consists of second pole resistor 46 and second pole capacitor 48.

The bandwidth of the PLL is calculated by $F_u = K_0 * I * R / 2 * \Pi * N$ where $K_0$ is the VCO 30 tuning sensitivity in Hertz/volts, I is the current pulse amplitude in amperes, R is the value of loop damping resistor 42 in Ohms. Capacitors 40, 44, 48 and resistor 46 are selected for desired loop dynamics. Values of components of the loop filter along with current I, $K_0$, and N determine response time to change in frequency and of the sampling frequency 25, 34 from the charge pump 28. A compromise exists between fast response time to changes in frequency and adequate suppression of spurious outputs from VCO 30.

FIG. 2 is a prior art block diagram of an improved phase lock loop shown in FIG. 1. It is currently implemented by National Semiconductor in their phase lock loop products, and henceforth is known as the "National" solution. The primary difference between the National solution in FIG. 2 and the prior art solution illustrated in FIG. 1 is in the loop filter 38. The National solution has an extra gating input to the loop filter 38. Charge pump 28 generates one of two currents 58. In the example illustrated in FIG. 2, the one current is four times the other current. In the high current mode, connection 59 of the loop filter 38 is connected to ground. At the same time that the current is increased by a factor of 4, the N divider 32 and the R divider 24 are each reduced by a factor of 4. The reason that this division or reduction is done is that by increasing the current by a factor of 4, reducing the two dividers 24, 32 by 4 and by reducing the damping resistor R 42 by 4, the result is a loop bandwidth that is 4 times greater than the original. The purpose of this increase in loop bandwidth is to make the response faster to a change in frequency. Note that loop filter capacitor 40 is replaced by loop capacitor filter 50, and loop damping resistor 42 is replaced by a first loop damping resistor 52 and a second loop damping resistor 54 in FIG. 2. In high current mode, the second or lower loop damping resistor 54 is shorted out of the circuit. First pole of the loop filter 44 is replaced by a comparable capacitor 56 in the National solution. Note however that the second pole of loop filter 38 consisting of resistor 46 and capacitor 48 has been removed. The reason for this removal is to not deteriorate loop stability in the high current mode.

The intent of this National solution approach is to allow a phase lock loop (PLL) to more quickly to adjust to a new output frequency. However, since the step size is four times larger than ultimately desired, a worse case frequency error can occur which is two times the desired channel spacing. As a result, the PLL locks quickly, but with the large frequency error, the time saved to arrive at a final frequency is not significantly improved. This problem is aggravated because the loop filter 38 must be slowed down to compensate for the lack of the second pole of the loop filter 38 comprising resistor 46 and capacitor 48. If the second pole of the loop filter 38 is not removed, the spurious output of the VCO 30 will often not be at an acceptable level.

BRIEF DESCRIPTION OF THE DRAWINGS

A better understanding of the present invention can be obtained when the following detailed description is considered in conjunction with the following drawings, in which.

DETAILED DESCRIPTION

The problems outlined above are solved by the present invention in two different ways. The solutions can divided into a hardware solution and a software solution. In the hardware solution, the charge pump has two outputs, a normal current output and a high current output. The loop filter is driven at two points to give the correct damping response for each output. Use of the charge pump itself, which is always switching, is glitch-free by design and is a well known technique. Simply disabling one or the other of the two output currents provides the error free transition from adapt to normal. This has advantages over the National approach which uses a gate to add a resistor to the filter. This added gate in the National solution is prone to glitches due to its inherent gate-to-drain capacitance. The generated glitch must then settle during the slow, narrow band mode. An added capacitor to the present invention allows a degree of freedom in designing the compound loop filter. One purpose of this capacitor is to bypass the portion of the loop of the filter that deals with the low frequency corner during the time the high current output is operating. Without this feature, it is more difficult to optimize PLL time and frequency responses. A trade-off must always be made between the degree of filtering possible to suppress spurious outputs of the Tri-State detector, while keeping the loop bandwidth as wide as possible so as to have fast adapted locktime.

The second facet of the solution implemented in the present invention is a software solution. Starting with the target output voltage $F_{ve}$, and the reference oscillator frequency $F_R$, the two divider constants R and N, can be computed to minimize the amount of resulting error. This is done by computing a N divisor, then an Error term, testing the Error term against a limit, and if the Error term is outside the limit, selecting another R divider term. This is repeated until an R divider term is identified that is within the specified range. For many applications, a small frequency error is acceptable. The software solution described hereinbelow provides a means of arriving at a set of divider values with a greatly reduced computational burden.

Figure 1:
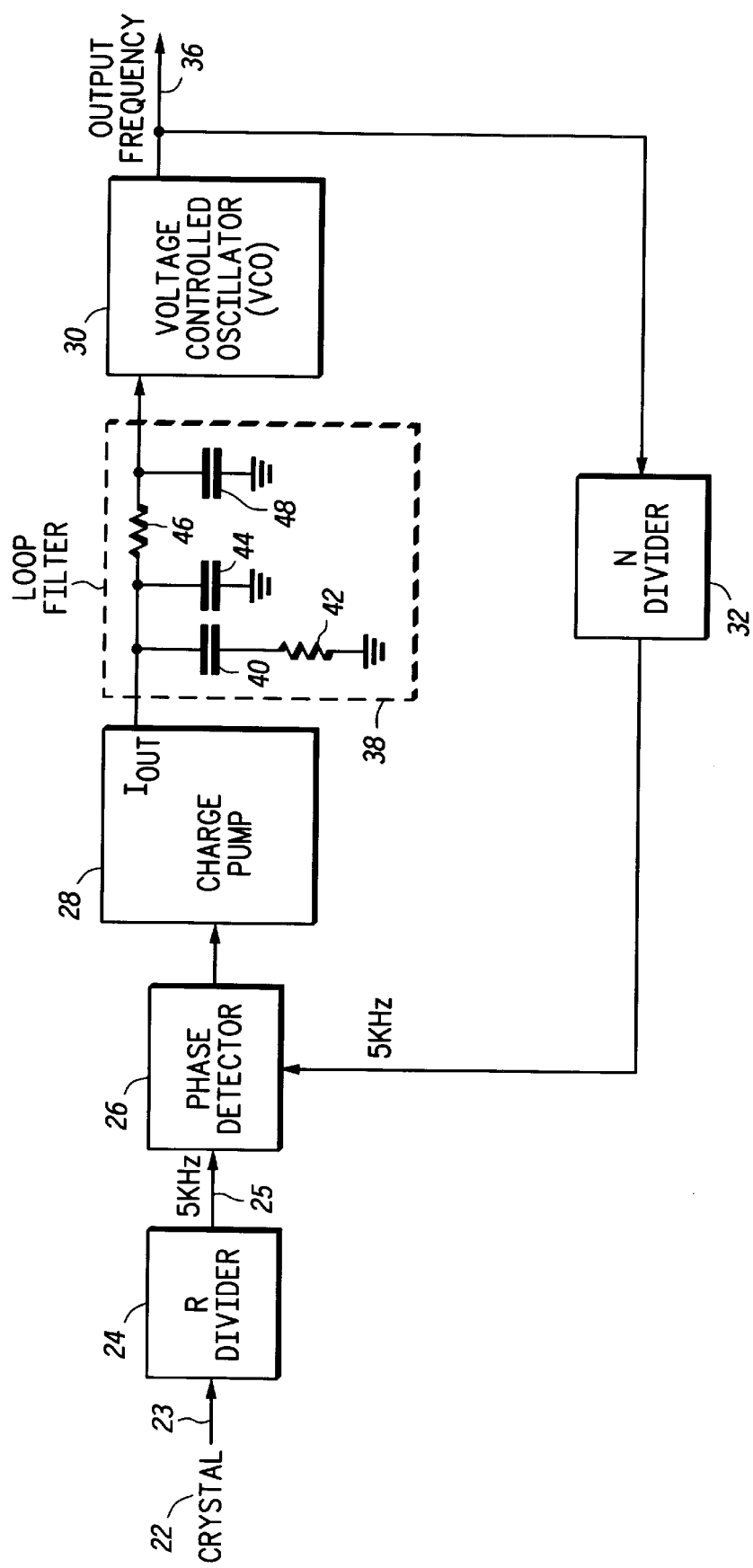
FIG. 1 is a prior art block diagram that illustrates a standard non-adaptive phase lock loop implementation.
Figure 2:
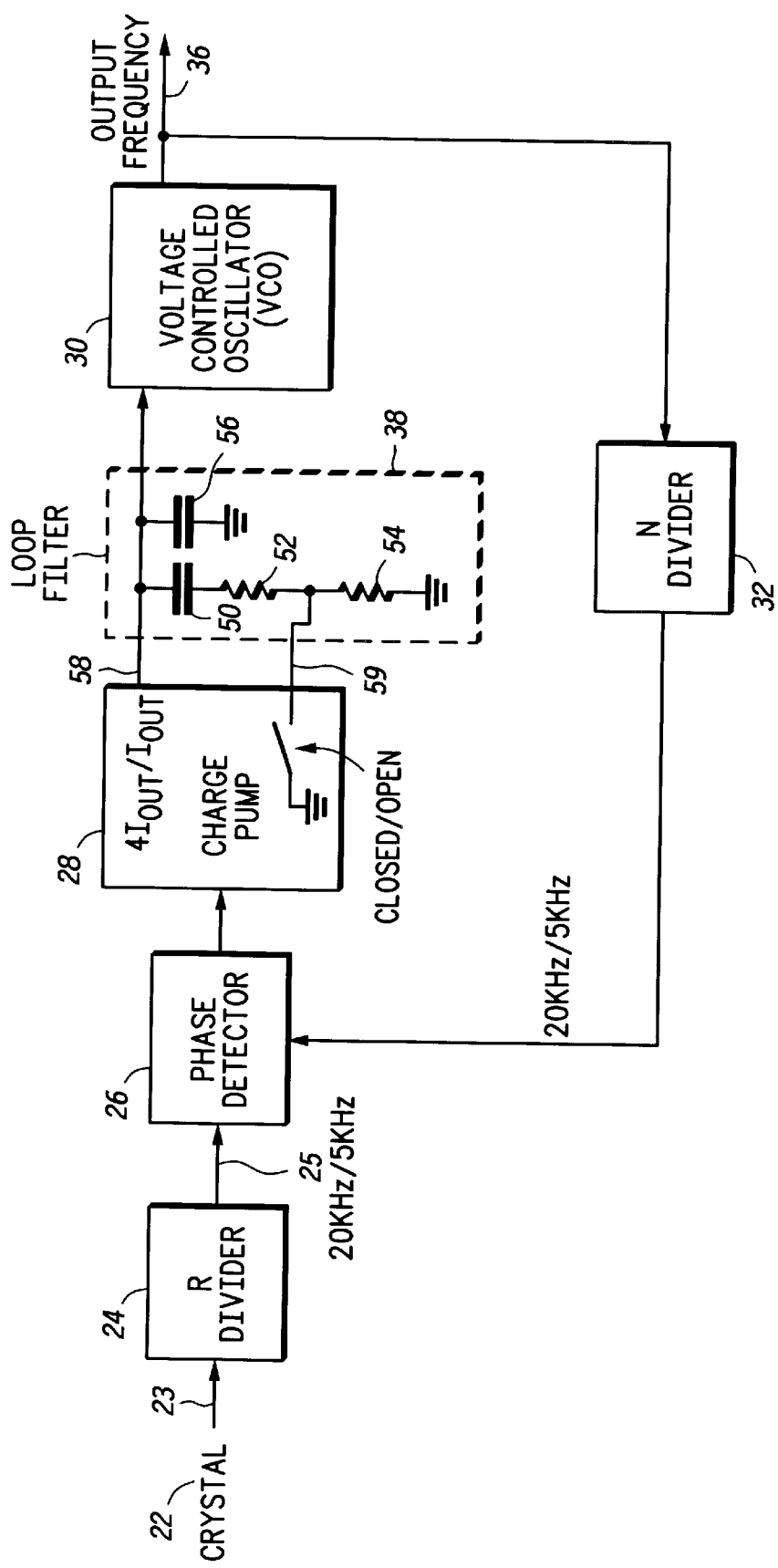
FIG. 2 is a prior art block diagram of an improved phase lock loop shown in FIG. 1.
Figure 3:
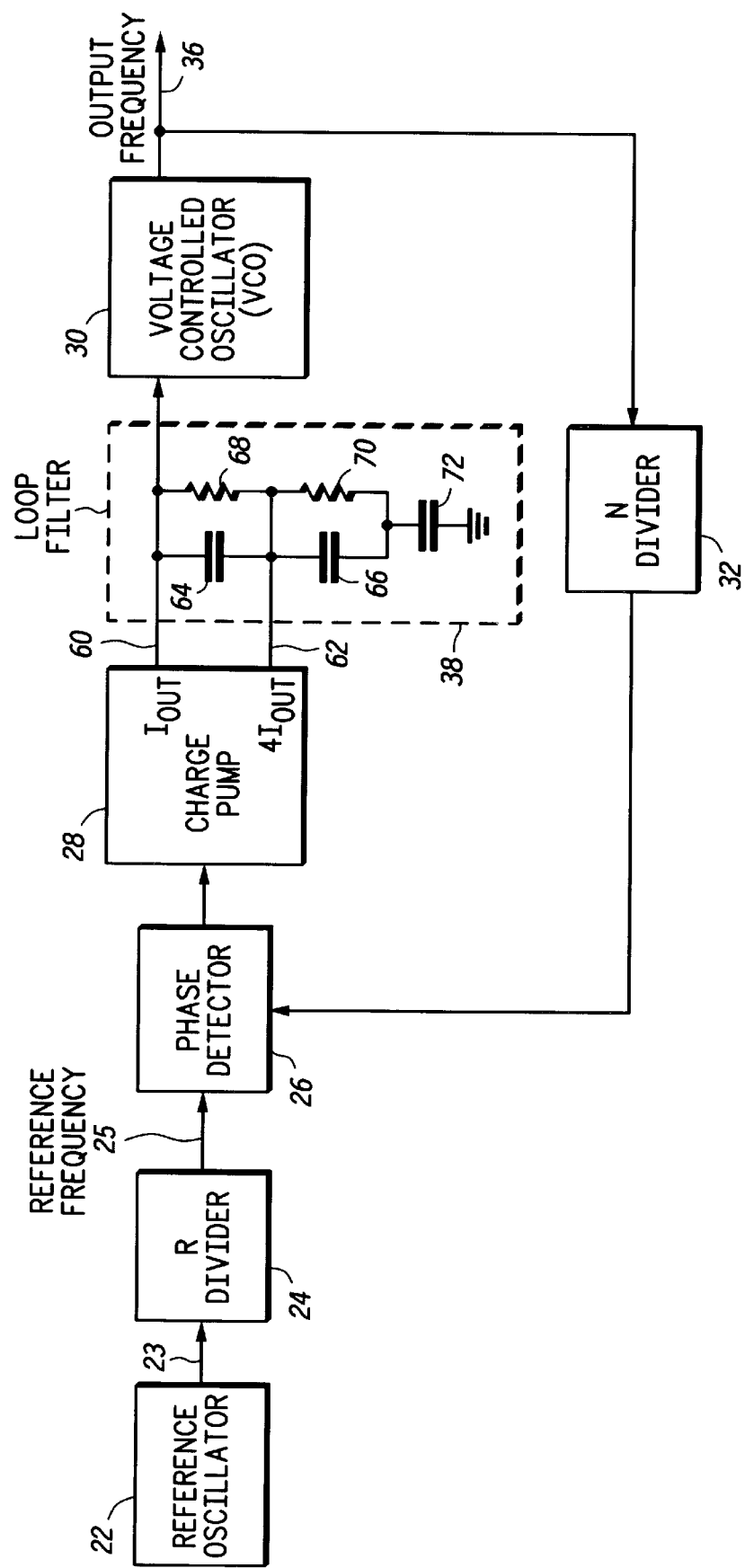
FIG. 3 is a block diagram of an improved phase lock loop system, in accordance with the present invention.

FIG. 3 is a block diagram of an improved phase lock loop system, in accordance with the present invention. Two parts of the phase lock loops shown in FIGS. 1 and 2 have been changed. The charge pump 28 has two outputs instead of the usual single output. The low current output 60 provides the current pulses commensurate with the final narrow loop bandwidth. The high current output 62 applied midpoint to the loop filter 38 provides output current pulses whose amplitude is larger than the current output 60, usually by factor equivalent to the ratio of N during and after adapt mode (or R during and after adapt). This modification factor is typically 4 or 8. Note that only one current output will be present at a time, the other one being open. This is commonly called a Tri-state.

Loop filter 38 consists of a low current first pole filter capacitor 64 coupled in parallel with a low current damping resistor 68. In series between the low current capacitor 64 and damping resistor 68 and ground is a second filter. The second part of the filter has a high current first pole filter capacitor 66 coupled in parallel with a high current damping resistor 70. These are coupled in series with a loop filter capacitor 72. High current damping resistor 70, and low current damping resistor 68 are selected such that the ratio of the high current damping resistor 70 to the value of the sum of the two damping resistors 68, 70 is the same as the amplitude of the current pulses from the low current charge pump output 60 and the high current charge pump output 62. The resistance of the high current damping resistor 70 times the high current output 62 will usually be the same as the current of the low current output 60 times the resistance of the two damping resistors 68, 70.

Figure 4:
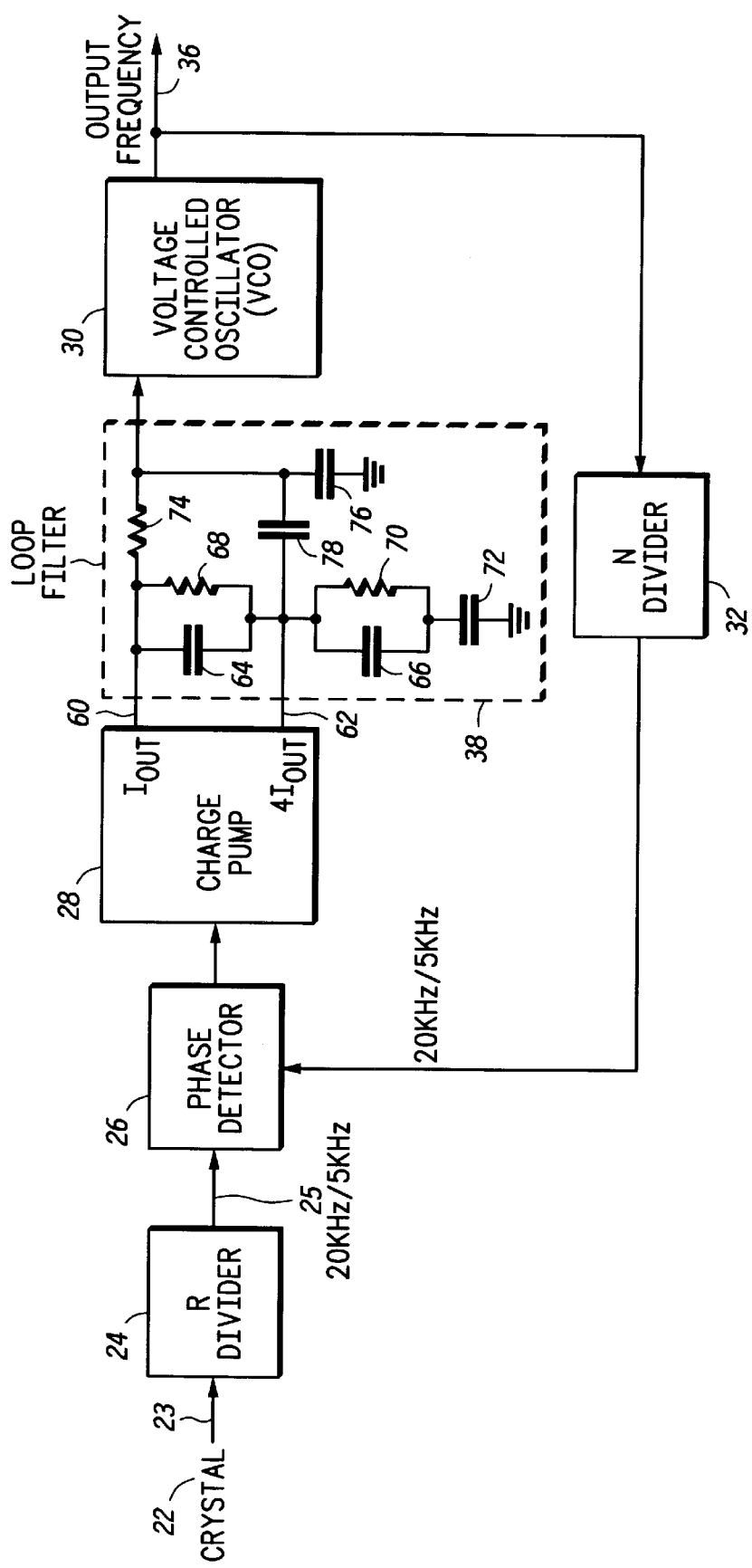
FIG. 4 is a block diagram illustrating the addition of a second pole of filtering to loop filter of FIG. 3.

FIG. 4 is a block diagram illustrating the addition of a second pole of filtering to loop filter 38 of FIG. 3. This second pole of filtering consists of resistor 74 and capacitor 76. The second pole resistor 74 is coupled between the low current output of the charge pump 60 and the voltage controlled oscillator 30. The second pole capacitor 76 is coupled between input to the VCO 30 and ground. To reduce the effects of this added pole in the high current mode, a feed forward capacitor 78 is added between the high current output 62 and the input to the VCO 30. This feed forward capacitor 78 allows the loop to remain stable in high current mode by reducing the effects of the low current damping resistor 68 and the second pole resistor 74 while not degrading spurious suppression in the low current non-adapt mode where spurious suppression is especially important.

Figure 5:
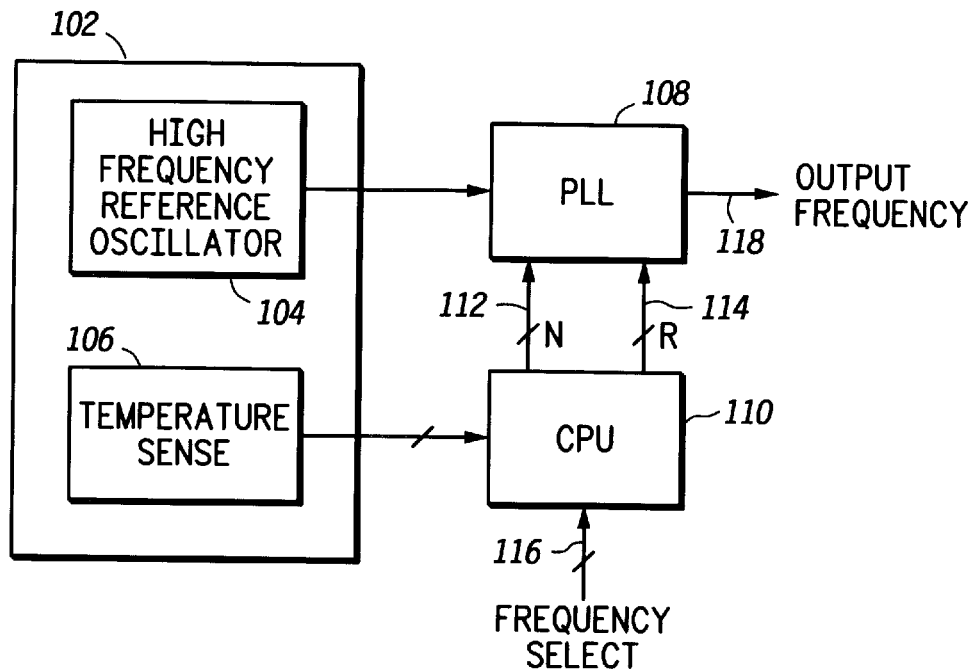
FIG. 5 is a block diagram illustrating one usage of dynamically computing N and R divisors, in accordance with the present invention.

FIG. 5 is a block diagram illustrating one usage of dynamically computing N and R divisors. A high frequency reference oscillator 104 and a temperature sensor 106 are contiguously located in an environment 102. For example, they may be both located on the same printed circuit board adjacent to each other. As with the phase lock loops illustrated in FIGS. 1–4, the output of the high frequency reference oscillator 104 is the driving input to phase lock loop 108. Input to a central processing unit (CPU) 110 or computer processor are the output of the temperature sensor 106 and a frequency select 116. The frequency select 116 is used to select the correct channel or frequency. Additionally, the CPU 110 is preloaded with a model, possibly located in a look-up table, of the characteristics of the oscillator 104 based on temperature. Often, oscillators have their characteristics characterized prior to purchase, and this characterization is preloaded into the CPU 110. The CPU 110 utilizes the information provided by the temperature sensor 106, the frequency select 116, and the preloaded oscillator configuration to tune divider values N 112 and R 114 to provide a more stable output frequency 118 than would be possible without this compensation. This allows temperature correction of the high frequency reference oscillator output to generate a fixed constant output frequency 118, over a range of varying temperatures without actually tuning the high frequency reference oscillator 104.

Figure 6:
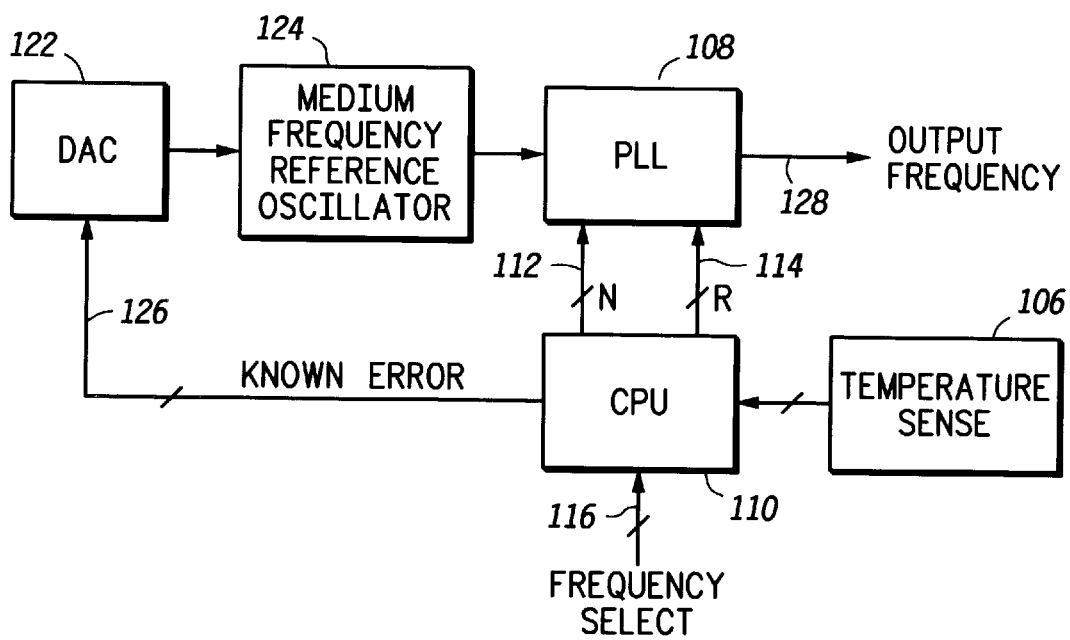
FIG. 6 is a block diagram illustrating temperature correction of a medium frequency oscillator, similar to that done for high frequency reference oscillator in FIG. 5.

FIG. 6 is a block diagram illustrating temperature correction of a medium frequency oscillator 124, similar to that done for high frequency reference oscillator 104 in FIG. 5. One disadvantage of the system illustrated in FIG. 5 is that it requires a high frequency reference oscillator 104 since the high frequency is necessary to provide a large number of possible solutions based on the integer granularity of the N divisor 112 and R divisor 114. In the case of a medium frequency reference oscillator 124, the integer granularity of the possible divisors N 112 and R 114 is proportionally reduced. For that reason, a second embodiment is illustrated. As with the system in FIG. 5, the medium frequency reference oscillator 124 output drives the phase lock loop 108. The output of the phase lock loop 108 is the generated output frequency 128. Again, as in FIG. 5, the other two inputs to the phase lock loop 108 are the N divisor 112 and the R divisor 114, both of which are generated by CPU 110. Input to the CPU 110 is temperature sensor 106, again located near the oscillator 124. Another input to the CPU 110 is frequency select 116. One additional output of the CPU 110 is a known error term 126 which is input into a digital analog converter 122. The N divisor 112 and the R divisor 114 generate a known error which can then be compensated by the CPU by adjusting the output frequency of the medium frequency reference oscillator 124. The digital analog converter (DAC) 122 takes the digital known error term 126 from the CPU 110 and converts the error term 126 to an analog correction voltage which is used to adjust the output frequency of the medium frequency reference oscillator 124.

Note that the software portion of this invention does not require temperature correction or use of a temperature sensor 106. Rather the use of temperature sensor 106 to temperature correct reference oscillators 104 and 124, is for illustrative purposes only to illustrate one application of the software portion of the present invention.

In many applications, a small frequency error is perfectly acceptable. This is evidenced by the common acceptance of frequency reference oscillators which typically have an error, due to setting tolerance, aging, and temperature, on the order of possibly several parts per million. The acceptable error is determined by the application and by applicable governmental regulations.

The method described hereinbelow takes advantage of the acceptable error by choosing a new, smaller set of values for the N and R divider values than would commonly be use for a given required step size. The small N divider value allows a larger loop bandwidth to be used without suffering a degradation of spurious output. A wider bandwidth has benefits relating to faster locktime and robustness to perturbations of the loop voltages. The method further provides a means of calculating an acceptable pair of N and R divider ratios with a reduced computation complexity. This results in a reduction of the number of multiplications and divisions necessary in order to compute the divider values. In addition to these speed benefits, such a method also eliminates the need for a large lookup table.

Figure 7:
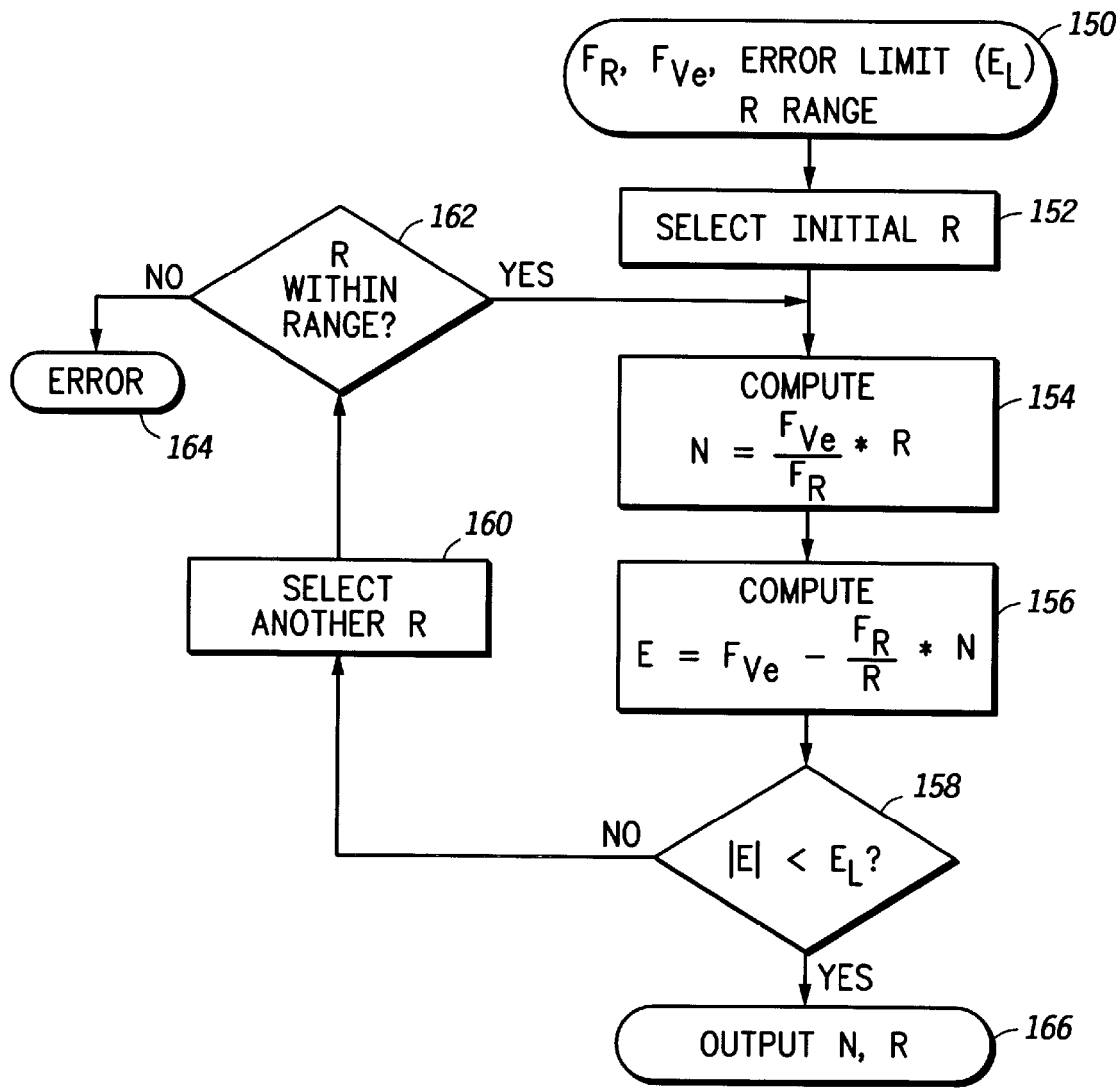
FIG. 7 is a flow chart illustrating an optimized method of computing the N divisor and the R divisor in according with the present invention.

FIG. 7 is a flow chart illustrating an optimized method of computing the N divisor 112 and the R divisor 114 in according with the present invention. Inputs 150 to the method are $F_R$, $F_{VE}$, Error Limit ($E_L$), and R Range. $F_R$ is a crystal oscillator reference frequency 23. $F_{VE}$ is the expected or target output 36 from the voltage controlled oscillator (VCO) 30. Additional inputs are a tolerable error limit ($E_L$), and the allowable range of the reference oscillator R divider 114.

The method starts by selecting an initial R divider value ($R_0$), step 152. Preferably, this is a value that results in the frequency output 25 of the R divider 24 ("R") four to eight times the normal step size. Then a loop is entered where the N divider frequency 112 ("N") is computed to be equal to $F_{VE}/F_R*R$, step 154. Next, an error ("E") is computed equal to $F_{VE}-(F_R/R)*N$, step 156. Note that N and R, as dividers, are integers. Therefore, the error term (E) computed in step 156 is the measure of the frequency error that results essentially from the noncontinuous nature of these numbers as integers. The error (E) is tested against the specified error limit ($E_L$), step 158. If the error term (E) is within the specified error limit ($E_L$), step 158, the N and R divider values are output, step 166, as being within range, and the method terminates normally.

Otherwise, another R divider value is selected, step 160. One embodiment is to select R back and forth around the initial R value selected. Thus, if the initial R value were 1,000, the next R value would be 1,001, then 999, then 1,002, then 999, etc.. A test is then made whether this newly selected R value is within the specified range, step 162. If the new R divider value is within the specified range, step 162, the loop repeats, computing a new N divider value, step 154. Otherwise, the method error terminates, step 164, indicating that no N and R divider combination could be found within the specified range. Note that in one embodiment, the R range is specified to be within 5–10% of the initial R value.

Figure 8:
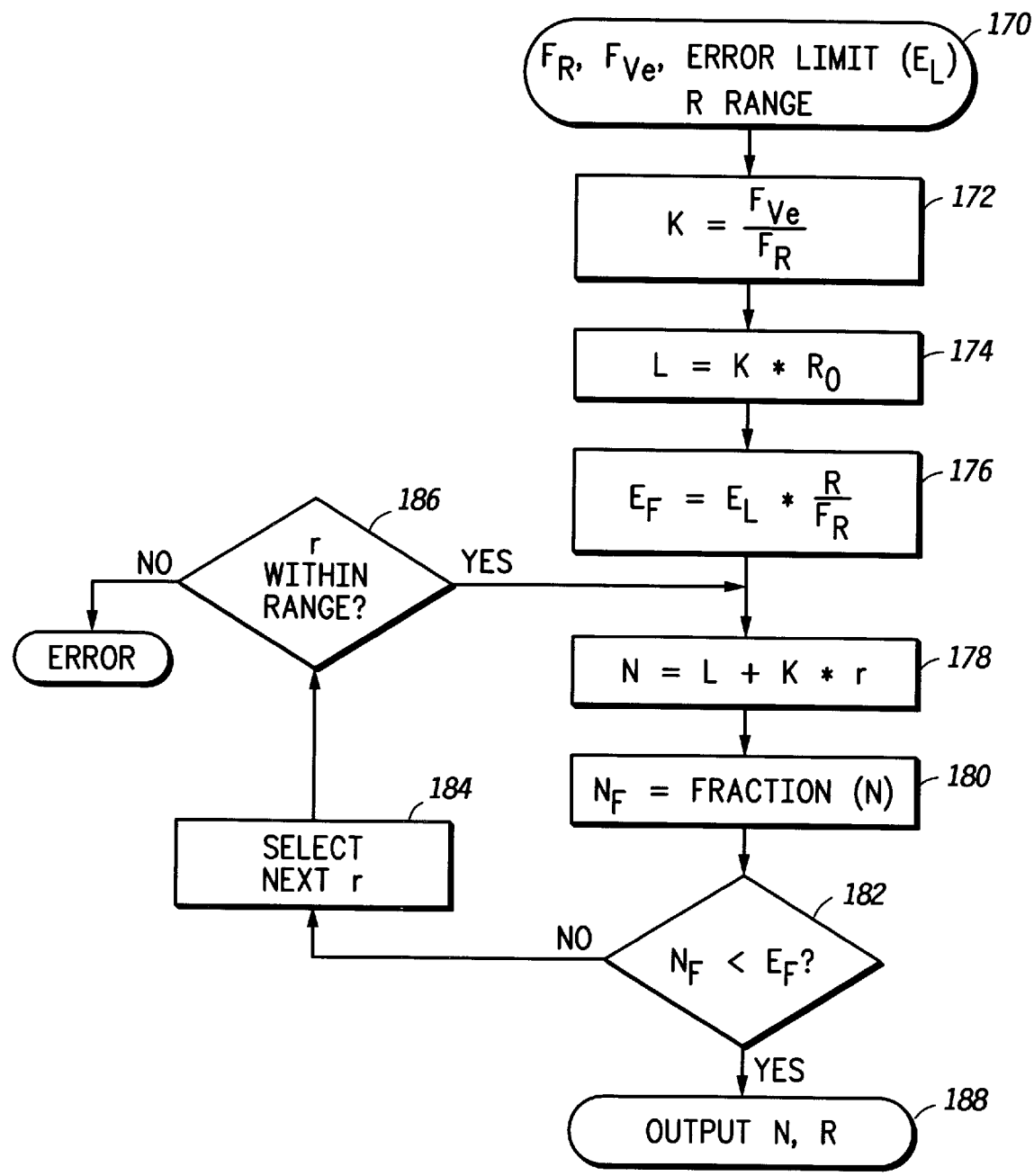
FIG. 8 is a flow chart that illustrates an optimized embodiment of the method in FIG. 7.

FIG. 8 is a flow chart that illustrates an optimized embodiment of the method in FIG. 7. Inputs 170 to the method are again $F_R$, $F_{VE}$, error limit ($E_L$), and R range. First, a constant K is computed to be equal to $F_{VE}/F_R$, step 172. Next, a constant L is computed equal to the constant $K*R_0$, where $R_0$ is an initial R divider value, step 174. Next, fractional error portion of N ($E_F$) is computed to be equal to $E_L*R_0/F_R$, step 176. An R divider increment ("r") is initialized equal to zero. Note that for small variations of R, it is sufficient to approximate the error limit ($E_L$) by using $R_0$ instead of the actual R divider value.

A loop is then entered, and an N divider value is computed to be equal to L+K*r, step 178. Next, the fractional portion ($N_F$) of the newly computed N divider value is isolated, step 180. The fractional part of N ($N_F$) is compared to the fractional error limit ($E_F$), step 182. If the fractional portion of N ($N_F$) is less than the fractional error term ($E_F$), step 182, the N and R divider values are output, step 188, and the method is complete.

Otherwise, the next R divider increment (r) is selected, step 184. A test is made whether the R divider increment (r) is within the specified range, step 186. This is equivalent to the test of R being within range in step 162 in FIG. 7. However, the R divider increment (r) is an integer offset from the initial R divider initial value ($R_0$). Thus, the R divider increment (r) can be incremented and decremented by one from zero. The special case of the R divider increment (r) equal to zero is the test of whether the initial R divider value ($R_0$) is within the specified range. In a one improvement, the computation of N can be optimized through use of a $N_{High}$ and $N_{Low}$, both initialized to L, and each incremented ($N_{High}$) or decremented ($N_{Low}$) by K each time through the loop. Indeed, one further improvement is to only retain the fractional part of $N_{High}$ and $N_{Low}$. If the R divider increment (r) is within the specified range, step 186, the loop is repeated, starting with computation of the new N divider value in step 178. Otherwise, the method error terminates, indicating that a N divider 112 and R divider 114 could not be found within allowable limits that translates the input frequency ($F_R$) 23 to the output frequency ($F_{VE}$) 36.

Those skilled in the art will recognize that modifications and variations can be made without departing from the spirit of the invention. Therefore, it is intended that this invention encompass all such variations and modifications as fall within the scope of the appended claims.

Claim elements and steps herein have been numbered and/or lettered solely as an aid in readability and understanding. As such, the numbering and/or lettering in itself is not intended to and should not be taken to indicate the ordering of elements and/or steps in the claims.

I claim:

1. A phase lock loop system receiving a reference frequency signal and generating an output frequency signal comprising:

a charge pump with a high current output and a low current output, wherein the charge pump will generate an output current on either the high current output or the low current output when the charge pump is active;

a loop filter responsively coupled to the charge pump and providing a loop filter output coupled to the low current output, said loop filter comprising:
   a first pole filter comprising:
      a low current first pole filter capacitor coupled between the high current output and the low current output,
      a low current first pole damping resistor coupled in parallel to the low current first pole filter capacitor,
      a high current first pole filter capacitor,
      a high current first pole damping resistor coupled in parallel to the high current first pole filter capacitor, and
      a first pole filter capacitor coupled in a series with the high current first pole filter capacitor, wherein:
         the series is coupled between the high current output and a ground;

a voltage controlled oscillator responsively coupled to the low current output and generating the output frequency signal;

an N frequency divider responsively coupled to the output frequency signal;

an R frequency divider responsive to the reference frequency signal; and a phase detector responsively coupled to the N frequency divider and the R frequency divider, wherein:
   the charge pump is responsively coupled to the phase detector.

2. The phase lock loop system in claim 1 wherein the loop filter further comprises:
   a second pole filter resistor coupled between the low current output and the loop filter output;
   a second pole damping capacitor coupled between the loop filter output and the ground; and
   a feed forward capacitor coupled between the high current output and the loop filter output.

3. The phase lock loop system in claim 1 wherein:
   a first ratio of a current from the high current output divided by a current from the low current output is an integer power of two (2).

4. The phase lock loop system in claim 3 wherein:
   the first ratio is equal to four (4).

5. The phase lock loop system in claim 3 wherein:
   the first ratio is equal to eight (8).

6. The phase lock loop system in claim 1 wherein:
   a first ratio of a current from the high current output divided by a current from the low current output is an integer that is not a power of two (2).

7. The phase lock loop system in claim 1 wherein:
   a first ratio of a current from the high current output divided by a current from the low current output is an non-integer value.

8. The phase lock loop system in claim 7 wherein:
   a second ratio of a sum of a resistance of the high current first pole damping resistor plus the low current first pole damping resistor divided by a resistance of the high current first pole damping resistor is equal to the first ratio.

9. The phase lock loop system in claim 1 wherein:
   the charge pump generates current on the low current output during steady state operation, and
   the charge pump selectively generates current on the high current output when changing the output frequency.

10. A system for temperature controlling the output frequency signal utilizing the phase lock loop system in claim 1 which further comprises:
   a high frequency reference oscillator that generates the reference frequency signal,
   a temperature sensor that provides a temperature signal that is a reasonable proxy for a temperature of the reference oscillator,
   a computer processor that provides an N divider value to control the N frequency divider and an R divider value to control the R frequency divider, wherein:
      the computer processor adjusts generation of the N divider value and the R divider value to control generation of the output frequency signal by the phase lock loop system in response to the temperature signal.

11. A system for temperature controlling the output frequency signal utilizing the phase lock loop system in claim 1 which further comprises:
   a digital analog converter;
   a medium frequency reference oscillator responsively coupled to the digital analog converter that generates the reference frequency signal;
   a temperature sensor that provides a temperature signal that is a reasonable proxy for a temperature of the reference oscillator,
   a computer processor that provides an N divider value to control the N frequency divider, an R divider value to control the R frequency divider, and a known error signal to control the digital analog converter, wherein:
      the computer processor adjusts generation of the N divider value, the R divider value, and the known error signal to control generation of the output frequency signal by the phase lock loop system in response to the temperature signal.

12. A system for dynamically controlling the output frequency signal utilizing the phase lock loop system in claim 1 which further comprises:
   a digital analog converter;
   a medium frequency reference oscillator responsively coupled to the digital analog converter that generates the reference frequency signal;
   a computer processor that provides an N divider value to control the N frequency divider, an R divider value to control the R frequency divider, and a known error signal to control the digital analog converter, wherein:
      the computer processor adjusts generation of the N divider value, the R divider value, and the known error signal to control generation of the output frequency signal by the phase lock loop system in response to a known error from a computation of the N divider value and the R divider value.

13. The phase lock loop system in claim 1 wherein:
   an N divider value to control the N frequency divider and an R divider value to control the R frequency divider are dynamically computed so that a frequency of the output frequency signal generated is within a specified frequency range.

14. The phase lock loop system in claim 13 wherein the N divider value and the R divider value are computed utilizing a method comprising:
   A) selecting an initial first integer divider ($R_0$) value as the R divider value;
   B) computing the N divider value to be equal to a product of a quotient of a target frequency ($F_{VE}$) divided by a reference frequency ($F_R$) multiplied times the first R divider value;

C) computing an error term (E) equal to a difference of the target frequency ($F_{VE}$) minus a product of a quotient of the reference frequency ($F_R$) divided by the R divider value times the N divider value;

D) testing to determine whether the error term (E) is within the specified error limit ($E_L$);

E) selecting a different integer divider value as the R divider value if the error term (E) was not determined to be within the specified error limit ($E_L$) in step (D); and F) repeating steps (B), (C), and (D) as a loop if the error term (E) was not determined to be within the specified error limit ($E_L$) in step (D).

15. A phase lock loop system receiving a reference frequency signal and generating an output frequency signal comprising:

a charge pump with a high current output and a low current output, wherein:
the charge pump will generate an output current on either the high current output or the low current output when the charge pump is active,
the charge pump generates current on the low current output during steady state operation, and
the charge pump selectively generates current on the high current output when changing the output frequency;

a loop filter responsively coupled to the charge pump and providing a loop filter output coupled to the low current output, said loop filter comprising:
a first pole filter comprising:
a low current first pole filter capacitor coupled between the high current output and the low current output,
a low current first pole damping resistor coupled in parallel to the low current first pole filter capacitor,
a high current first pole filter capacitor,
a high current first pole damping resistor coupled in parallel to the high current first pole filter capacitor, and
a first pole filter capacitor coupled in a series with the high current first pole filter capacitor, wherein:
the series is coupled between the high current output and a ground,
a second pole filter comprising:
a second pole filter resistor coupled between the low current output and the loop filter output,
a second pole damping capacitor coupled between the loop filter output and the ground, and
a feed forward capacitor coupled between the high current output and the loop filter output;

a voltage controlled oscillator responsively coupled to the low current output and generating the output frequency signal;

an N frequency divider responsively coupled to the output frequency signal;

an R frequency divider responsive to the reference frequency signal; and a phase detector responsively coupled to the N frequency divider and the R frequency divider, wherein:
the charge pump is responsively coupled to the phase detector.

16. A phase lock loop system receiving a reference frequency signal and generating an output frequency signal comprising:

a charge pump means with a high current output and a low current output, wherein the charge pump means will generate an output current on either the high current output or the low current output when the charge pump means is active;

a means for providing a loop filter responsively coupled to the charge pump means and providing a loop filter output coupled to the low current output, said loop filter comprising:
a first pole filter comprising:
a low current first pole filter means for providing capacitance coupled between the high current output and the low current output,
a low current first pole damping means for providing resistance coupled in parallel to the low current first pole filter means for providing capacitance,
a high current first pole filter means for providing capacitance,
a high current first pole damping means for providing resistance coupled in parallel to the high current first pole filter means for providing capacitance, and
a first pole filter means for providing capacitance coupled in a series with the high current first pole filter means for providing capacitance, wherein:
the series is coupled between the high current output and a ground;

a means for providing voltage controlled oscillation responsively coupled to the low current output and generating the output frequency signal;

an N frequency divider means responsively coupled to the output frequency signal;

an R frequency divider means responsive to the reference frequency signal; and a means for detecting phase responsively coupled to the N frequency divider means and the R frequency divider means, wherein:
the charge pump means is responsively coupled to the means for detecting phase.

* * * * *